(12) United States Patent
Li et al.

(10) Patent No.: US 10,964,529 B2
(45) Date of Patent: Mar. 30, 2021

(54) METHOD FOR CLEANING LANTHANUM GALLIUM SILICATE WAFER

(71) Applicant: Institute of Microelectronics, Chinese Academy of Sciences, Beijing (CN)

(72) Inventors: Dongmei Li, Beijing (CN); Lei Zhou, Beijing (CN); Shengfa Liang, Beijing (CN); Xiaojing Li, Beijing (CN); Hao Zhang, Beijing (CN); Changqing Xie, Beijing (CN); Ming Liu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 15/300,925

(22) PCT Filed: Apr. 17, 2014

(86) PCT No.: PCT/CN2014/075562
§ 371 (c)(1),
(2) Date: Sep. 30, 2016

(87) PCT Pub. No.: WO2015/157957
PCT Pub. Date: Oct. 22, 2015

(65) Prior Publication Data
US 2017/0018424 A1    Jan. 19, 2017

(51) Int. Cl.
*H01L 21/02*   (2006.01)
*B08B 3/12*    (2006.01)
(Continued)

(52) U.S. Cl.
CPC .......... *H01L 21/02082* (2013.01); *B08B 3/12* (2013.01); *C11D 3/3947* (2013.01);
(Continued)

(58) Field of Classification Search
CPC .......... B05B 13/06; B08B 1/006; B08B 3/12; C11D 11/0047; C11D 11/007;
(Continued)

(56) References Cited

U.S. PATENT DOCUMENTS

| 5,698,038 A * | 12/1997 | Guldi ................ H01L 21/67051 134/1 |
| 6,996,882 B2 * | 2/2006 | Onishi ................ H03H 9/0222 29/25.35 |

(Continued)

FOREIGN PATENT DOCUMENTS

| CN | 101125416 A | 2/2008 |
| CN | 101350238 A | 1/2009 |

(Continued)

OTHER PUBLICATIONS

CN 103111434 A, Machine Translation.*
(Continued)

*Primary Examiner* — Nadine G Norton
*Assistant Examiner* — Christopher Remavege
(74) *Attorney, Agent, or Firm* — Schwegman Lundberg & Woessner, P.A.

(57) ABSTRACT

The present disclosure provides a method for cleaning a lanthanum gallium silicate wafer which comprises the following steps: at a step of 1, a cleaning solution constituted of phosphorous acid, hydrogen peroxide and deionized water is utilized to clean the lanthanum gallium silicate wafer with a megahertz sound wave; at a step of 2, the cleaned lanthanum gallium silicate wafer is rinsed and dried by spinning; at a step of 3, a cleaning solution constituted of ammonia, hydrogen peroxide and deionized water is utilized to clean the lanthanum gallium silicate wafer with the megahertz sound wave; at a step of 4, the cleaned lanthanum gallium silicate wafer is rinsed and dried by spinning; and at
(Continued)

a step of 5, the rinsed and dried wafer is placed in an oven to be baked. The present invention shortens a period of acidic cleaning process and prolongs a period of alkaline cleaning and utilizes a more effective cleaning with megahertz sound wave to replace the conventional ultrasonic cleaning to solve the issue of cleaning the lanthanum gallium silicate wafer after a cutting process and to improve surface cleanliness of the lanthanum gallium silicate wafer to get a better cleaning effect.

8 Claims, 4 Drawing Sheets

(51) Int. Cl.
| | | |
|---|---|---|
| *C11D 11/00* | (2006.01) | |
| *C11D 7/06* | (2006.01) | |
| *C11D 7/08* | (2006.01) | |
| *C11D 3/39* | (2006.01) | |
| *C11D 7/10* | (2006.01) | |

(52) U.S. Cl.
CPC ................ *C11D 7/06* (2013.01); *C11D 7/08* (2013.01); *C11D 7/10* (2013.01); *C11D 11/007* (2013.01); *C11D 11/0047* (2013.01); *H01L 21/02052* (2013.01)

(58) Field of Classification Search
CPC ........... C11D 3/3947; C11D 7/06; C11D 7/08; C11D 7/10; H01L 21/02052; H01L 21/02082
USPC ........... 134/1; 29/25.35, 594, 830, 831, 835; 156/153; 310/313 R, 348
See application file for complete search history.

(56) References Cited

U.S. PATENT DOCUMENTS

| | | | | |
|---|---|---|---|---|
| 8,163,093 | B1* | 4/2012 | Chen .................. | B08B 3/12 134/1 |
| 2001/0009341 | A1* | 7/2001 | Kumatoriya .......... | C30B 33/00 310/313 A |
| 2001/0048266 | A1* | 12/2001 | Murai .................... | C30B 33/00 310/313 R |
| 2003/0144163 | A1* | 7/2003 | Morinaga ............... | C11D 1/72 510/175 |
| 2006/0130871 | A1* | 6/2006 | Hwang .................. | B08B 3/12 134/1 |
| 2006/0264011 | A1* | 11/2006 | Hachigo ........... | H01L 21/02052 438/483 |
| 2008/0296738 | A1* | 12/2008 | Nishiura ................ | C30B 29/42 257/631 |
| 2010/0043189 | A1* | 2/2010 | Fukano ................. | H03H 9/059 29/25.35 |
| 2010/0244631 | A1* | 9/2010 | Kobayashi .............. | H03H 3/02 310/346 |
| 2014/0145558 | A1* | 5/2014 | Hori ....................... | H03H 3/02 310/313 R |

FOREIGN PATENT DOCUMENTS

| | | | |
|---|---|---|---|
| CN | 101798089 A | | 8/2010 |
| CN | 102218410 A | | 10/2011 |
| CN | 103111434 A | * | 5/2013 |
| CN | 103878145 A | | 6/2014 |
| JP | 2006242850 A | | 9/2006 |

OTHER PUBLICATIONS

"International Application No. PCT/CN2014/075562, International Search Report dated Jan. 16, 2015", w/ English Translation, (Jan. 16, 2015), 5 pgs.

"International Application No. PCT/CN2014/075562, Written Opinion dated Jan. 16, 2015", (Jan. 16, 2015), 4 pgs.

Beck, Mark, "Chapter 15 Megasonic Cleaning Action", Handbook for Critical Cleaning: Cleaning Agents and Systems, Second Edition,CRC Press, (2011), 11 pgs.

\* cited by examiner

Before cleaning　　　　　　　　　　After cleaning

METHOD FOR CLEANING LANTHANUM GALLIUM SILICATE WAFER

PRIORITY APPLICATIONS

This application is a U.S. National Stage Filing under 35 U.S.C. 371 from International Application No. PCT/CN2014/075562, filed on 17 Apr. 2014, and published as WO2015/157957 on 22 Oct. 2015; which application and publication are incorporated herein by reference in its entirety.

TECHNICAL FIELD

The present application relates to a method for cleaning lanthanum gallium silicate wafer so as to solve an issue of cleaning the lanthanum gallium silicate wafer after a cutting process and to improve surface cleanliness of the lanthanum gallium silicate wafer.

BACKGROUND

At present, an acoustic surface wave device generally utilizes a piezoelectric material such as lithium niobate, lithium tantalite, quartz or the like as a substrate. However, there are respective disadvantages for these materials: the lithium niobate and lithium tantalite has a poor thermal stability; the quartz crystal has a lower electromechanical coupling coefficient; a quartz based SAW device has defects of small bandwidth and larger insertion loss occurs $\alpha$-$\beta$ phase change around 573° C., so it is not suitable for a high temperature sensor, Since it is found that the lanthanum gallium silicate (langasite, $La_3Ga_5SiO_{14}$, LGS) crystal may be applied in acoustic surface wave and bulk wave in the middle of 1990s, such a crystal is rapidly paid attention to in the piezoelectric field. As a new type of piezoelectric crystal, the lanthanum gallium silicate crystal has a moderate electromechanical coupling coefficient and better temperature stability, so it may meet a basic requirement of the SAW device on the substrate material.

At present, the method for manufacturing a device based on lanthanum gallium silicate mainly uses a manufacturing process of silicon integrated circuit for reference. However, since a material characteristic of the lanthanum gallium silicate crystal is different from that of single crystal silicon, it is impossible to mechanically apply the relevant process of the silicon integrated circuit. Thus, such a process needs to be modified on the basis of the manufacturing process of silicon integrated circuit to comply with the material characteristic of the lanthanum gallium silicate. For example, it is difficult for the single crystal silicon to be dissolved in various strong acid solutions, so the conventional process for cleaning the silicon integrated circuit usually utilizes the strong acid solution as a cleaning reagent.

FIG. 1 is a schematic view of etched states of the lanthanum gallium silicate wafer by different acid solutions. As shown in FIG. 1, various strong acid solutions may lead to corresponding corrosion on the lanthanum gallium silicate crystal and have higher corrosion rates. Thus, the conventional cleaning process needs to be modified to comply with the lanthanum gallium silicate crystal.

SUMMARY

As for it, a primary object of the present invention is to provide a method for cleaning lanthanum gallium silicate wafer so as to solve an issue of cleaning the lanthanum gallium silicate wafer after a cutting process and to improve surface cleanliness of the lanthanum gallium silicate wafer.

In order to achieve the above object, the present invention provides a method for cleaning lanthanum gallium silicate wafer which comprises the following steps.

At a step of 1, a cleaning solution constituted of phosphoric acid, hydrogen peroxide and deionized water is utilized to clean the lanthanum gallium silicate wafer with a megahertz sound wave;

At a step of 2, the cleaned lanthanum gallium silicate wafer is rinsed and dried by spinning;

At a step of 3, a cleaning solution constituted of ammonia, hydrogen peroxide and deionized water is utilized to clean the lanthanum gallium silicate wafer with the megahertz sound wave;

At a step of 4, the cleaned lanthanum gallium silicate wafer is rinsed and dried by spinning;

At a step of 5, the rinsed and dried wafer is placed in an oven to be baked.

In the technical solution as mentioned above, at the step of 1, the cleaning solution constituted of phosphoric acid, hydrogen peroxide and deionized water has a mass ratio of H3PO4:H2O2:H2O of 1:1:50~100.

In the technical solution as mentioned above, at the step of 1, the cleaning with the megahertz sound wave is implemented at a temperature of 50~60° C. for 10 minutes.

In the technical solution as mentioned above, at the step of 2, the lanthanum gallium silicate wafer is rinsed by deionized water at a room temperature for 10 minutes.

In the technical solution as mentioned above, at the step of 3, the cleaning solution constituted of ammonia, hydrogen peroxide and deionized water has a mass ratio of $NH_3$:$H_2O_2$:$H_2O$ of 1:2:50-100.

In the technical solution as mentioned above, at the step of 3, the cleaning with the megahertz sound wave is implemented at a temperature of 50-60° C. for 50 minutes.

In the technical solution as mentioned above, at the step of 4, the lanthanum gallium silicate wafer is rinsed by deionized water at a room temperature for 10 minutes.

In the technical solution as mentioned above, at the step of 5, the lanthanum gallium silicate wafer is baked in a drying oven at a temperature of 40-90° C. for 20-30 minutes.

The method for cleaning the lanthanum gallium silicate wafer modifies a conventional cleaning process for characteristic of the lanthanum gallium silicate wafer by shortening a period of acidic cleaning process and prolonging a period of alkaline cleaning on the basis of the conventional method for cleaning semiconductor wafer. Meanwhile, a more effective cleaning with megahertz sound wave is utilized to replace a conventional ultrasonic cleaning to solve the issue of cleaning the lanthanum gallium silicate wafer after a cutting process and to improve surface cleanliness of the lanthanum gallium silicate wafer to get a better cleaning effect.

BRIEF DESCRIPTION OF THE DRAWINGS

In order to further illustrate contents of the present invention, the present invention will be illustrated in detail in conjunction with the accompany figures, in which.

DETAILED DESCRIPTION

In order to make the objective, technical solution and advantages of the present invention become apparent, the present invention will be further illustrated in detail with reference to accompany figures.

Figure 1:
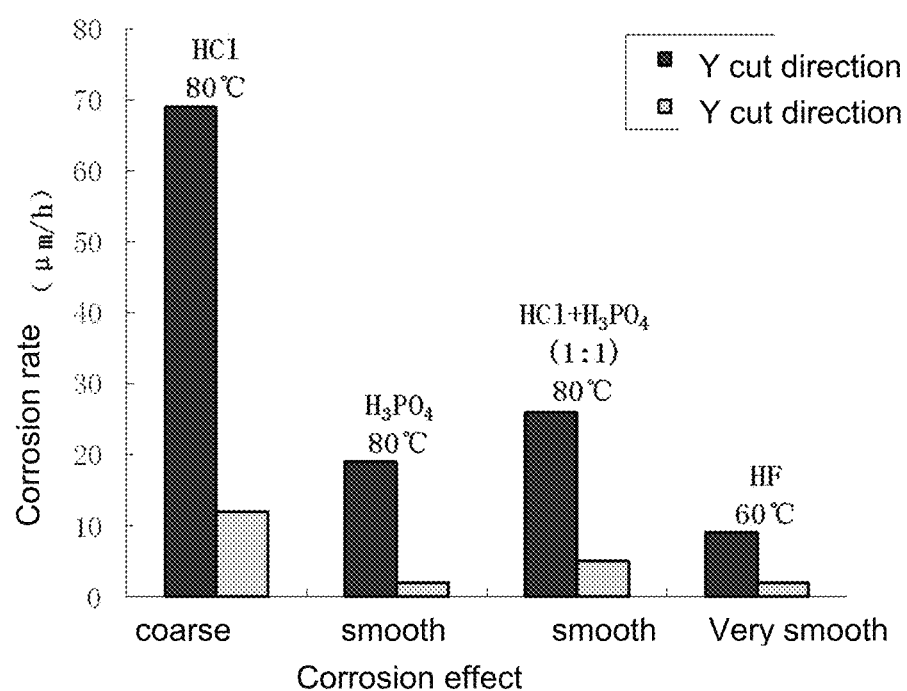
FIG. 1 is a schematic view of etched states of the lanthanum gallium silicate wafer by different acid solutions.

FIG. 1 is a schematic view of etched states of the lanthanum gallium silicate wafer by different acid solutions, which shows that various acid solutions have certain etching effects on the lanthanum gallium silicate wafer, but the corrosivity of phosphoric acid is much weaker than that of the regularly used hydrochloric acid in the conventional cleaning solutions.

Figure 2:
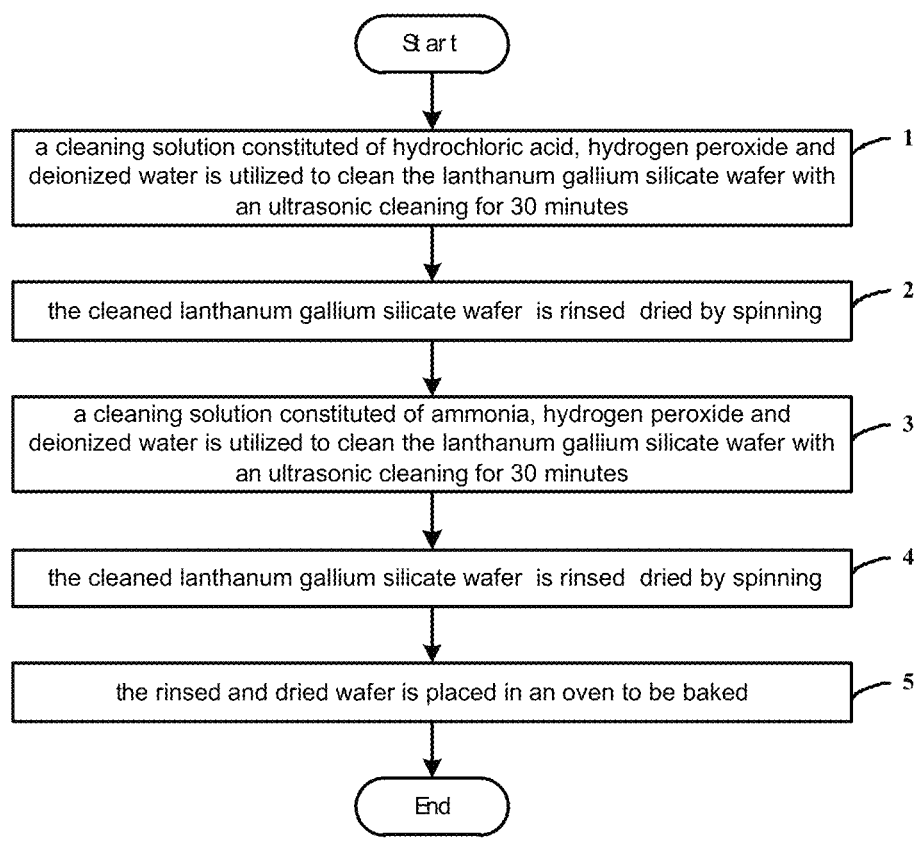
FIG. 2 is a flow process chart of a cleaning process which is regularly used in a conventional silicon integrated circuit industry.

FIG. 2 is a flow process chart of a cleaning process which is regularly used in a conventional silicon integrated circuit industry. As can be seen from FIG. 2, in the conventional cleaning process, hydrochloric acid is usually used as a primary component of the acidic cleaning solution, and the period for cleaning with the acidic cleaning solution is longer than the period for cleaning with the alkaline cleaning solution, and such a cleaning process may lead to corruption of the lanthanum gallium silicate. The conventional cleaning process utilizes an ultrasonic cleaning method, the effect of which is worse than that of the megahertz sound wave cleaning.

Figure 3:
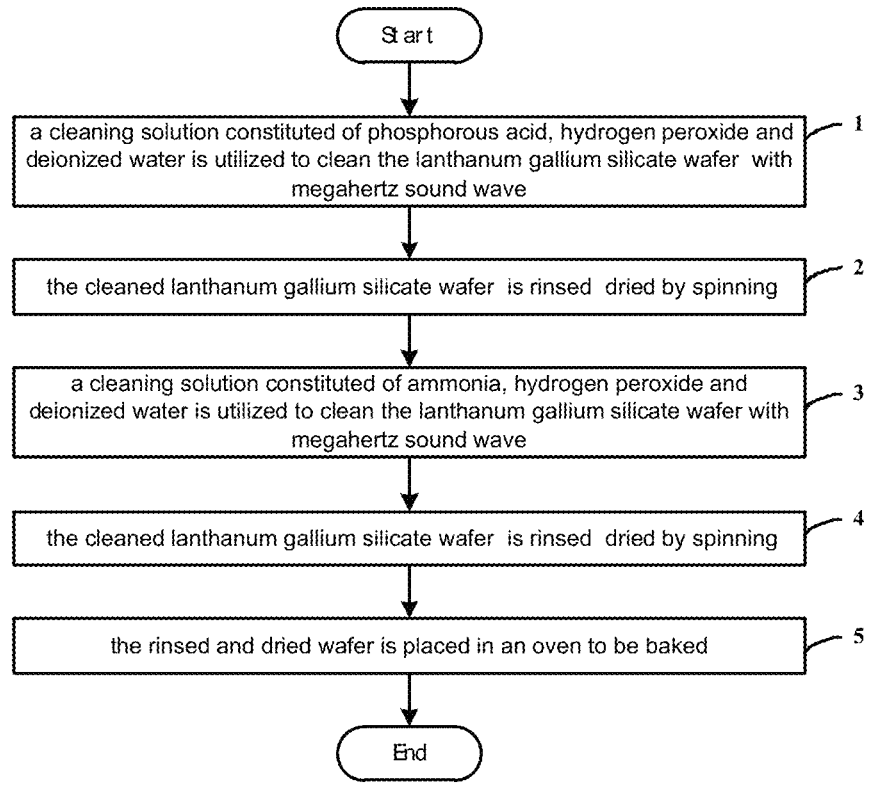
FIG. 3 is a flow chart of a method for cleaning lanthanum gallium silicate wafer according to the present invention.

FIG. 3 is a flow chart of a method for cleaning lanthanum gallium silicate wafer according to the present invention, which modifies the conventional cleaning process for characteristic of the lanthanum gallium silicate wafer. On the basis of the conventional method for cleaning the semiconductor wafer as shown in FIG. 2, the method utilizes phosphoric acid which has a weak corrosivity on the lanthanum gallium silicate wafer to replace the hydrochloric acid which has a strong corrosivity on the lanthanum gallium silicate wafer, so the period of acidic cleaning process is shorten and the period of alkalinous cleaning process is prolonged. Furthermore, a more effective megahertz sound wave cleaning process is utilized to replace the conventional ultrasonic cleaning. In particular, the method comprises the following steps.

At a step of 1, a cleaning solution constituted of phosphoric acid, hydrogen peroxide and deionized water is utilized to clean the lanthanum gallium silicate wafer with a megahertz sound wave, in which the cleaning solution constituted of phosphoric acid, hydrogen peroxide and deionized water has a mass ratio of H3PO4:H2O2:H2O of 1:1:50~100, and the cleaning method is the megahertz sound wave cleaning at a temperature of 50~60° C. for 10 minutes.

At a step of 2, the lanthanum gallium silicate wafer cleaned at the step of 1 is rinsed in the deionized water and is dried by spinning, in which the period for rinsing is 10 minutes.

At a step of 3, a cleaning solution constituted of ammonia, hydrogen peroxide and deionized water is utilized to clean the lanthanum gallium silicate wafer with the megahertz sound wave, in which the cleaning solution constituted of ammonia, hydrogen peroxide and deionized water has a mass ratio of $NH_3:H_2O_2:H_2O$ of 1:2:50-100, and the cleaning method is the megahertz sound wave cleaning at a temperature of 50~60° C. for 50 minutes.

At a step of 4, the lanthanum gallium silicate wafer cleaned at the step of 3 is rinsed in the deionized water and is dried by spinning, in which the period for rinsing is 10 minutes.

At a step of 5, the wafer rinsed and dried at the step of 4 is placed in an oven to be baked, in which the lanthanum gallium silicate wafer is baked in a drying oven at a temperature of 40-90° C. for 20-30 minutes. Then, the whole cleaning process is ended.

The present invention utilize the alkalinous hydrogen peroxide solution and the megahertz sound wave cleaning method to clean the lanthanum gallium silicate wafer by synthetically utilizing physical and chemical cleaning methods, so it effectively improve cleanness of the surface of the lanthanum gallium silicate wafer.

Figure 4:
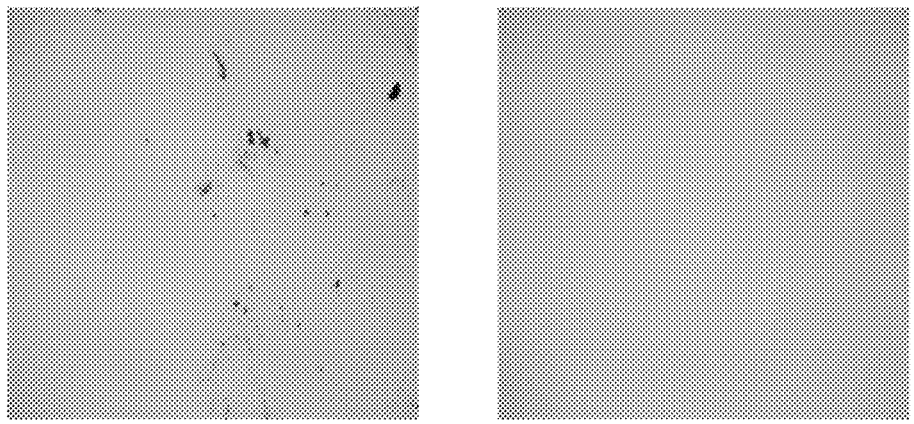
FIG. 4 is a test image of a surface of the lanthanum gallium silicate wafer captured by an optical microscope before and after being cleaned by utilizing the present invention.

FIG. 4 is a test image of a surface of the lanthanum gallium silicate wafer captured by an optical microscope before and after being cleaned by utilizing the present invention. As can be seen from FIG. 4, by utilizing the cleaning method of the present invention to clean the lanthanum gallium silicate wafer, an amount of the contaminants is decreased and the cleanness is improved. Thus, the method for cleaning the lanthanum gallium silicate wafer according to the present invention has an excellent cleaning effect and a higher cleanness.

Figure 5:
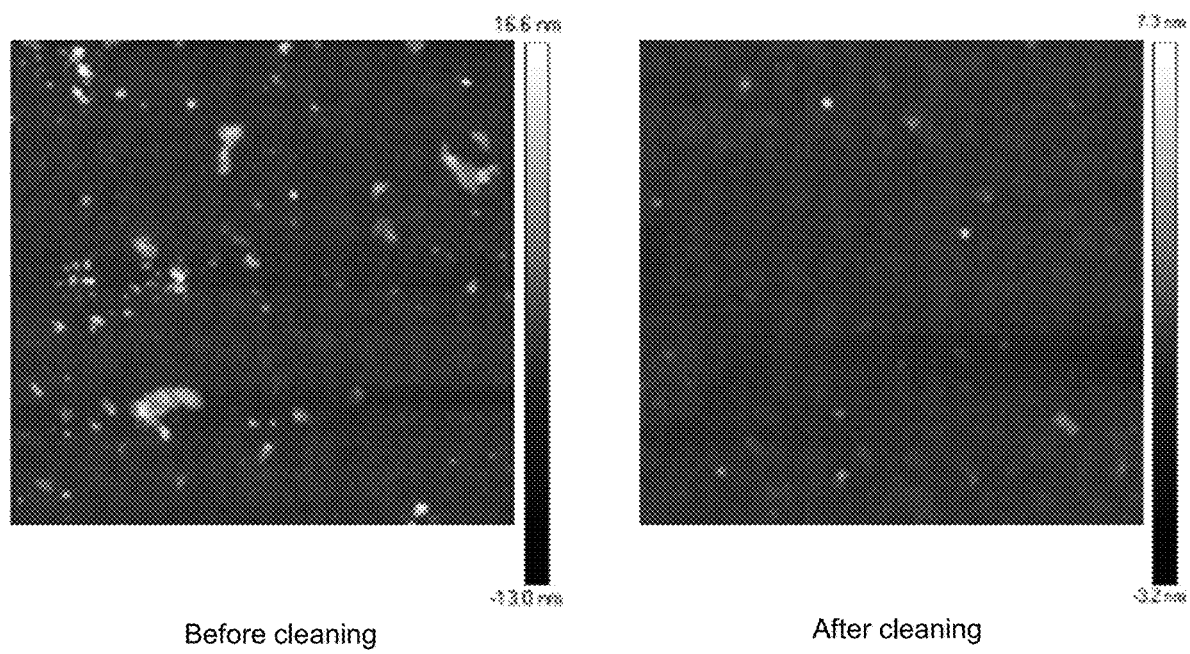
FIG. 5 is a test image of a surface of the lanthanum gallium silicate wafer captured by an atom force microscope (AFM) before and after being cleaned by utilizing the present invention.

FIG. 5 is a test image of a surface of the lanthanum gallium silicate wafer captured by an atom force microscope (AFM) before and after being cleaned by utilizing the present invention. As can be seen from FIG. 5, the method for cleaning the lanthanum gallium silicate wafer of the present invention makes no damage on the lanthanum gallium silicate wafer and obtains a better cleaning effect.

The particular embodiments as mentioned above further illustrate the objective, technical solution and advantages of the present invention in detail. It should be understood that the above descriptions are only particular embodiments of the present invention and are not intended to limit the present invention. All of the modifications, equivalent replacements and improvements within the spirit and principle of the present invention are included in the scope of the present invention.

The invention claimed is:

1. A method for cleaning a lanthanum gallium silicate wafer comprising:
   at a step of 1, utilizing an acidic cleaning solution comprising phosphoric acid, hydrogen peroxide and deionized water to clean the lanthanum gallium silicate wafer with a megahertz sound wave;
   at a step of 2, rinsing and drying the cleaned lanthanum gallium silicate wafer by spinning;
   at a step of 3, utilizing an alkaline cleaning solution comprising ammonia, hydrogen peroxide and deionized water to clean the lanthanum gallium silicate wafer with the megahertz sound wave;
   at a step of 4, rinsing and drying the cleaned lanthanum gallium silicate wafer by spinning; and
   at a step of 5, baking the rinsed and dried wafer in an oven,
   wherein a time period for alkaline cleaning is longer than that for acidic cleaning, and wherein the method uses only phosphoric acid without using any other acid.

2. The method for cleaning a lanthanum gallium silicate wafer according to claim 1, wherein at the step of 1, the cleaning solution constituted of phosphoric acid, hydrogen peroxide and deionized water has a mass ratio of $H_3PO_4$:$H_2O_2$:$H_2O$ of 1:1:50~100.

3. The method for cleaning a lanthanum gallium silicate wafer according to claim 1, wherein at the step of 1, the cleaning with the megahertz sound wave is implemented at a temperature of 50~60° C. for 10 minutes.

4. The method for cleaning a lanthanum gallium silicate wafer according to claim 1, wherein at the step of 2, the lanthanum gallium silicate wafer is rinsed by deionized water at a room temperature for 10 minutes.

5. The method for cleaning a lanthanum gallium silicate wafer according to claim 1, wherein at the step of 3, the cleaning solution constituted of ammonia, hydrogen peroxide and deionized water has a mass ratio of $NH_3$:$H_2O_2$:$H_2O$ of 1:2:50-100.

6. The method for cleaning a lanthanum gallium silicate wafer according to claim 1, wherein at the step of 3, the cleaning with the megahertz sound wave is implemented at a temperature of 50-60° C. for 50 minutes.

7. The method for cleaning a lanthanum gallium silicate wafer according to claim 1, wherein at the step of 4, the lanthanum gallium silicate wafer is rinsed by deionized water at a room temperature for 10 minutes.

8. The method for cleaning a lanthanum gallium silicate wafer according to claim 1, wherein at the step of 5, the lanthanum gallium silicate wafer is baked in a drying oven at a temperature of 40-90° C. for 20-30 minutes.

* * * * *